United States Patent
Shibata et al.

(10) Patent No.: US 9,525,444 B2
(45) Date of Patent: Dec. 20, 2016

(54) ADAPTIVE ELEMENT SHUFFLER

(71) Applicants: Hajime Shibata, Toronto (CA); Donald Paterson, Winchester, MA (US); Trevor Caldwell, Toronto (CA); Ali Sheikholeslami, Toronto (CA); Zhao Li, Toronto (CA)

(72) Inventors: Hajime Shibata, Toronto (CA); Donald Paterson, Winchester, MA (US); Trevor Caldwell, Toronto (CA); Ali Sheikholeslami, Toronto (CA); Zhao Li, Toronto (CA)

(73) Assignee: Analog Devices Global, Hamilton (BM)

(*) Notice: Subject to any disclaimer, the term of this patent is extended or adjusted under 35 U.S.C. 154(b) by 67 days.

(21) Appl. No.: 13/946,428

(22) Filed: Jul. 19, 2013

(65) Prior Publication Data

US 2015/0023455 A1     Jan. 22, 2015

(51) Int. Cl.
| | |
|---|---|
| *H04B 1/7117* | (2011.01) |
| *H04B 1/10* | (2006.01) |
| *H03M 1/06* | (2006.01) |
| *H03M 3/00* | (2006.01) |

(52) U.S. Cl.
CPC ............ *H04B 1/10* (2013.01); *H03M 1/0665* (2013.01); *H03M 3/338* (2013.01)

(58) Field of Classification Search
CPC ...................... H04B 1/7117; H04B 2001/0425
USPC .................................................. 375/346, 316
See application file for complete search history.

(56) References Cited

U.S. PATENT DOCUMENTS

| | | | | |
|---|---|---|---|---|
| 4,965,667 A | * | 10/1990 | Trew et al. | 375/240.21 |
| 5,283,780 A | * | 2/1994 | Schuchman et al. | 370/312 |
| 5,465,181 A | * | 11/1995 | Yoshinaka | 386/264 |
| 5,841,766 A | * | 11/1998 | Dent et al. | 370/321 |
| 6,331,834 B1 | * | 12/2001 | Smith | 341/155 |
| 6,611,221 B1 | | 8/2003 | Soundarapandian et al. | |
| 6,810,198 B1 | * | 10/2004 | Kuroda et al. | 386/232 |
| 7,864,903 B2 | * | 1/2011 | Murakami et al. | 375/347 |
| 2002/0075943 A1 | * | 6/2002 | Kurihara | 375/146 |
| 2004/0105489 A1 | * | 6/2004 | Kim et al. | 375/140 |
| 2004/0114901 A1 | * | 6/2004 | Baechtle | 385/136 |
| 2004/0222909 A1 | * | 11/2004 | Wang | 341/144 |
| 2005/0013352 A1 | * | 1/2005 | Hottinen | 375/219 |
| 2005/0031062 A1 | * | 2/2005 | Shim et al. | 375/347 |
| 2006/0274861 A1 | * | 12/2006 | Langenbach | H04L 25/03197 375/341 |
| 2007/0076817 A1 | * | 4/2007 | Suh | H04L 27/265 375/303 |

(Continued)

OTHER PUBLICATIONS

L. R. Carley, "A Noise-Shaping Coder Topology for 15+ Bit Converters," IEEE Journal of Solid-State Circuits, vol. 24, No. 2, Apr. 1989, pp. 267-273.

(Continued)

*Primary Examiner* — Michael Neff
(74) *Attorney, Agent, or Firm* — Patent Capital Group

(57) ABSTRACT

A system may include a detector, a controller, a shuffler, and a processor. The detector may detect a signal. The controller may control the shuffler based upon the signal. The shuffler may shuffle a plurality of channels at the input of a plurality of processing elements of the processor based upon the signal. The processor may process the signal according to the plurality of channels as configured by the shuffler.

22 Claims, 4 Drawing Sheets

(56) References Cited

U.S. PATENT DOCUMENTS

| | | | |
|---|---|---|---|
| 2007/0104085 A1* | 5/2007 | Sambhwani | H04B 1/7097 370/203 |
| 2007/0274318 A1* | 11/2007 | Ochiai | 370/394 |
| 2008/0045157 A1* | 2/2008 | Takahashi | 455/67.11 |
| 2009/0245392 A1* | 10/2009 | Leung et al. | 375/240.27 |
| 2013/0207819 A1* | 8/2013 | Banarie et al. | 341/131 |

OTHER PUBLICATIONS

W. Yang et al., "A 100mW 10MHz-BW CT Delta-Sigma Modulator with 87dB DR and 91dBc IMD," IEEE International Solid-State Circuits Conference, Digest of Technical Papers, Feb. 2008, pp. 498-499, 631.

L. Risbo et al., "Digital aAproaches to ISI-Mitigation in High-Resolution Oversampled Multi-Level D/A Converters," IEEE Journal of Solid-State Circuits, vol. 46, No. 12, Dec. 2011, pp. 2892-2903.

T. Caldwell et al., "Electric Signal Conversion," co-pending U.S. Appl. No. 13/905,251, filed May 30, 2013. (25 pages, not yet published).

European Search Report issued in European Patent Application No. 14175320.2, communication dated Nov. 26, 2014, 12 pages.

Notice of Allowance in EP Patent Application Serial No. 14175320.2 mailed Oct. 22, 2015, 23 pages.

\* cited by examiner

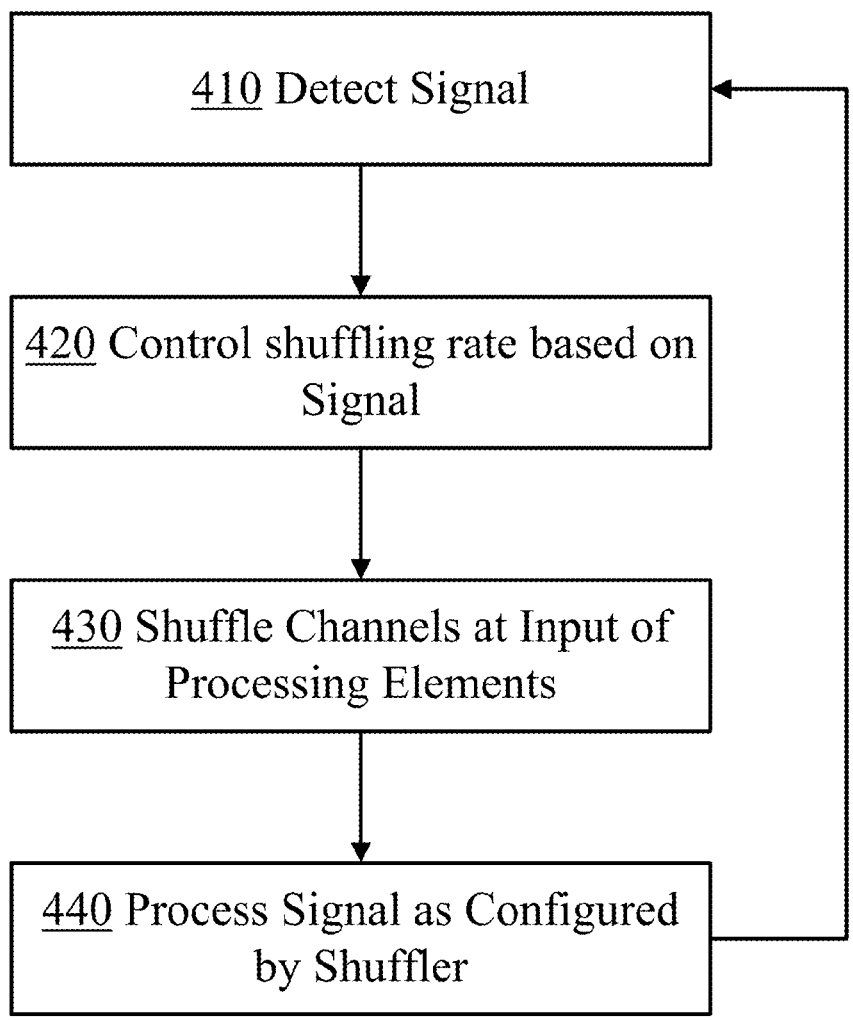

ADAPTIVE ELEMENT SHUFFLER

BACKGROUND

Systems or circuits that perform signal processing may be found in various applications such as audio/video processing, telecommunication transceivers, etc. Signal processing systems may perform different types of processing, such as filtering, transforming, merging, etc. Signal processing systems may convert signals between analog form and digital form by using analog-to-digital converters (ADC) and digital-to-analog converters (DAC). To increase speed and/or accurate, signal processing systems may each include multiple processing elements each configured to perform similar signal processing functions, and the multiple processing elements may be linked in parallel and/or in series with each other. This may also reduce the cost of designing the signal processing systems, because the multiple processing elements may be duplicated in design without the need to design and simulate each element.

However, even with duplicated designs of the multiple processing elements in a signal processing system, some mismatches in the performance characteristics of the processing elements may be unavoidable, due to variations in manufacturing. The element mismatches may cause distortions in the output signal. For example, a dominant distortion source in $\Delta\Sigma$ ADC's is element mismatches in the internal DAC's of the $\Delta\Sigma$ ADC's. To reduce the distortion caused by the element mismatches, processing elements may be periodically "shuffled" in the signal processing system. That is, the signal processing system may periodically re-route the signal channel/path configuration of the processing elements, so that the processing elements occupy different positions in the signal processing path relative to their previous positions. As the elements are shuffled over time while the signal processing system functions, the distortions due to element mismatches may be compensated. However, the element shuffling scheme may introduce additional element activities, which may introduce noise and thus may degrade the signal-to-noise ratio (SNR) of the signal processing system.

Thus, there is a need for improved signal processing system that reduces the distortions due to element mismatches while minimizing noise due to element shuffling.

BRIEF DESCRIPTION OF THE DRAWINGS

FIG. 4 illustrates a method according to an embodiment of the present disclosure.

DETAILED DESCRIPTION

Figure 1:
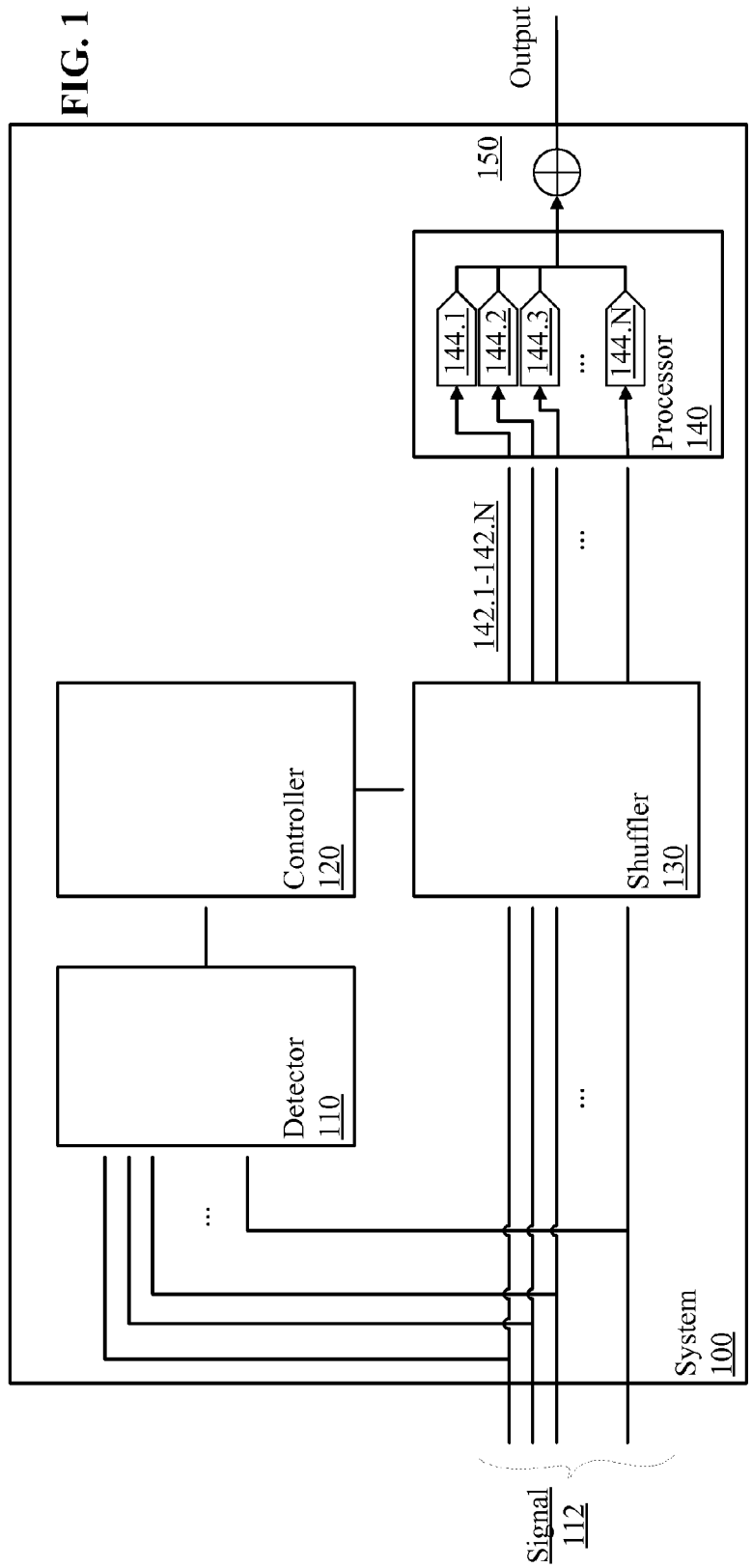
FIG. 1 illustrates a simplified block diagram of a system according to an embodiment of the present disclosure.

According to an exemplary embodiment of the present invention illustrated in FIG. 1, a system 100 may include a detector 110, a controller 120, a shuffler 130, and a processor 140. The detector 110 may detect a signal 112. The controller 120 may control the shuffler 130 based upon the signal 112. The shuffler 130 may shuffle a plurality of channels 142.1-142.N at the input of a plurality of processing elements 144.1-144.N of the processor 140 based upon the signal 112. The processor 140 may process the signal 112 according to the plurality of channels 142.1-142.N as configured by the shuffler 130.

The shuffler 130 may shuffle the plurality of channels 142.1-142.N at the input of the plurality of processing elements 144.1-144.N of the processor 140 based upon amplitude or frequency of the signal 112, such that after each shuffle, at least one of the processing elements 144.1-144.N occupy different positions in the signal processing path of the processor 140 relative to before shuffling. The controller 120 may control the shuffler 130 to begin shuffling after determining that the amplitude of the signal 112 is greater than or equal to a first threshold. The controller 120 may control the shuffler 130 to begin shuffling after determining that the amplitude of the signal 112 is greater than or equal to the first threshold over a first period of time, and may switch off shuffling after determining that the amplitude of the signal 112 is less than the first threshold over a second period of time.

The shuffler 130 may include a plurality of switches controlled by the controller 120 to shuffle the channels 142.1-142.N. Positions of the processing elements 144.1-144.N in the signal processing path may represent the bit order (for example, higher or lower order bits of a digital signal) associating to each of the process elements 144.1-144.N, the sequence order of processing associating to each of the process elements 144.1-144.N, or etc. For example, a digital signal in FIG. 1 may have N bits, each bit may be associated with a specific processing element 144.1-144.N, and the shuffler 130 may shuffle the channels 142.1-142.N to re-arrange the association of the processing elements 144.1-144.N to different bits after each shuffle.

Optionally, system 100 may include other components, for example a summer 150 to integrate or merge plurality of channels. In FIG. 1, the processing elements 144.1-144.N are depicted as DAC's. However, other types of processing elements and configurations may be used to implement different signal processing functions in system 100. For example, processor 140 may include a plurality of ADC's as processing elements in a cascade configuration with each ADC processing element outputting to the input of the next ADC processing element. The processing elements 144.1-144.N may include sample-and-hold circuits, ADC's, DAC's, or filters.

The controller 120 may control the shuffler 130 to shuffle at a first frequency after determining that the amplitude of the signal 112 is between a first threshold and a second threshold over a first period of time, and shuffle at a second frequency after determining that the amplitude of the signal 112 is greater than or equal to a second threshold over a third period of time. The first threshold may be less than the second threshold. The first frequency may be less than the second frequency. The shuffler 130 may shuffle at first or second frequencies, such that at least one of the processing elements 144.1-144.N occupy different positions in the signal processing path of the processor 140 once every clock period of the first or second frequencies. Additionally, the controller 120 may control the frequency of shuffling vary proportionally with the amplitude of the signal.

The controller 120 may control the shuffler 130 to switch from lower shuffling frequencies to higher shuffling frequencies with less delay than when switching from higher shuffling frequencies to lower shuffling frequencies. That is, the shuffler 130 may switch from lower shuffling frequencies to higher shuffling frequencies after system 100 detecting an increase in signal amplitude for a short duration (or instantaneous change), and may switch from higher shuffling frequencies to lower shuffling frequencies after system 100 detecting a decrease in signal amplitude for a longer duration. This may be referred to as the "fast attack slow decay" activity control, and this may provide the benefit of keeping higher shuffling frequencies for longer durations, and preventing the system 100 from switching shuffling frequencies too often. System 100 may include memories or buffers or timers to measure the periods of time used for detection above.

Figure 3:
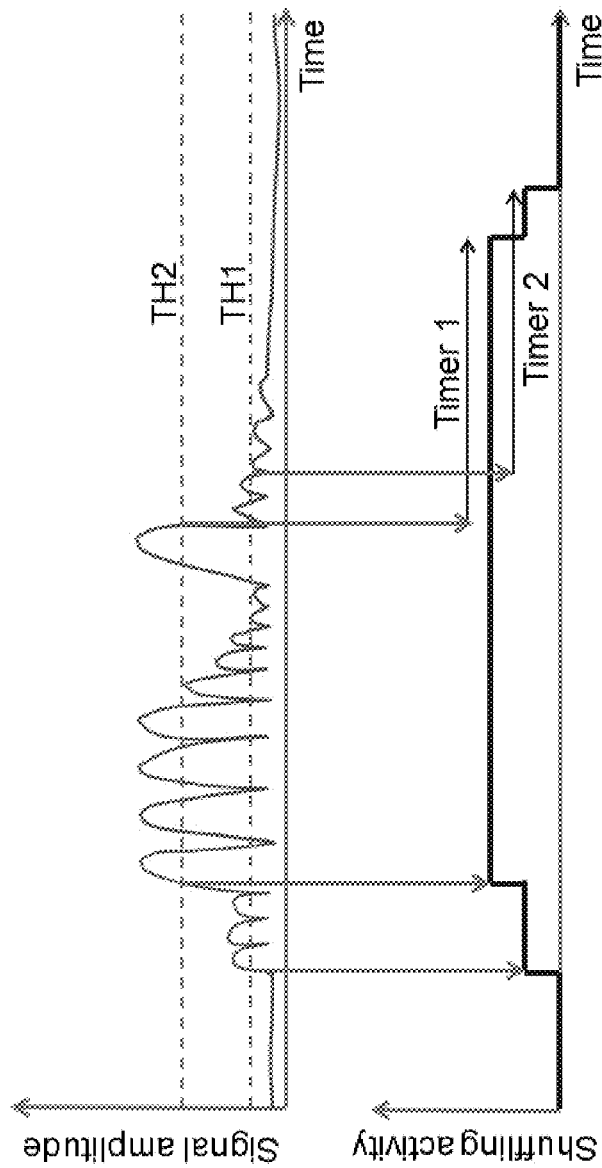
FIG. 3 illustrates a timing diagram of a shuffling activity based on signal amplitude according to an embodiment of the present disclosure.

An example time-domain behavior of the "fast attack slow decay" activity control is illustrated in FIG. 3. When the detected amplitude is below a certain threshold TH1, the shuffler 130 may be turned off. When the amplitude exceeds the threshold level TH1 but below the threshold level TH2, the shuffler 130 may shuffle the processing elements by shuffling for example once every 2 clock cycles. This shuffle rate may increase more when the amplitude exceeds the higher threshold level TH2, which may result in a faster shuffling rate for example once every 1 clock cycle.

When the signal amplitude decreased, the shuffler rate may continue for a time period (for example, Timer 1 and Timer 2 determined time periods), and then reduce. This fast-attack and slow-decay behavior of the controller 120 may be advantageous to maintain the low distortion performance for signals, whose signal amplitude may change between levels over a long time period (such as closely-spaced two-tone signal).

Additional thresholds and frequencies may be implemented. The first and second thresholds, the first, second, and third period of time, and the first and second frequencies may be adjusted or tuned dynamically while the system 100 is processing signals. The first and second frequencies may be randomized within ranges of frequencies by the controller 120, and may be tuned to avoid specific frequencies that might cause noise in the system 100. The frequencies may be randomized by adding or multiplying random numbers to specified base frequencies.

Generally, when the amplitude of the signal for processing is relatively low, distortions caused by element mismatches may not be significant in the output, thus shuffling the processing elements may not reduce much distortion, but the shuffling itself may increase noise in the signal processing system. Therefore, it may beneficial to decrease shuffling frequency or shut down shuffling when signal has lower amplitude.

The amplitude of the signal 112 may be determined or calculated by detector 110 based upon the overall signal amplitude of the signal 112, or may be determined based upon the amplitude of a selective ranges or bands or individuals of frequencies within the signal 112. The amplitude of the signal 112 may be calculated by its instantaneous value or root mean square (RMS) value. This may allow the system 100 to be fine tuned to compensate for specific distortions.

Additionally, the controller 120 may monitor the performance of the system 100 by measuring the output to determine the amount of distortions, and dynamically adjust or tune the above mentioned parameters for detection and shuffling. For example, the controller 120 may record the past shuffling pattern or processing element positions, and may randomize and/or tune the future shuffling patterns, to even out distortions due to element mismatches.

System 100 may be configured as part of a ADC system or a ΔΣ ADC system.

System 100 in FIG. 1 illustrates one possible configuration where detector 110 detects signal 112 directly to determine the amplitude of signal 112.

Figure 2:
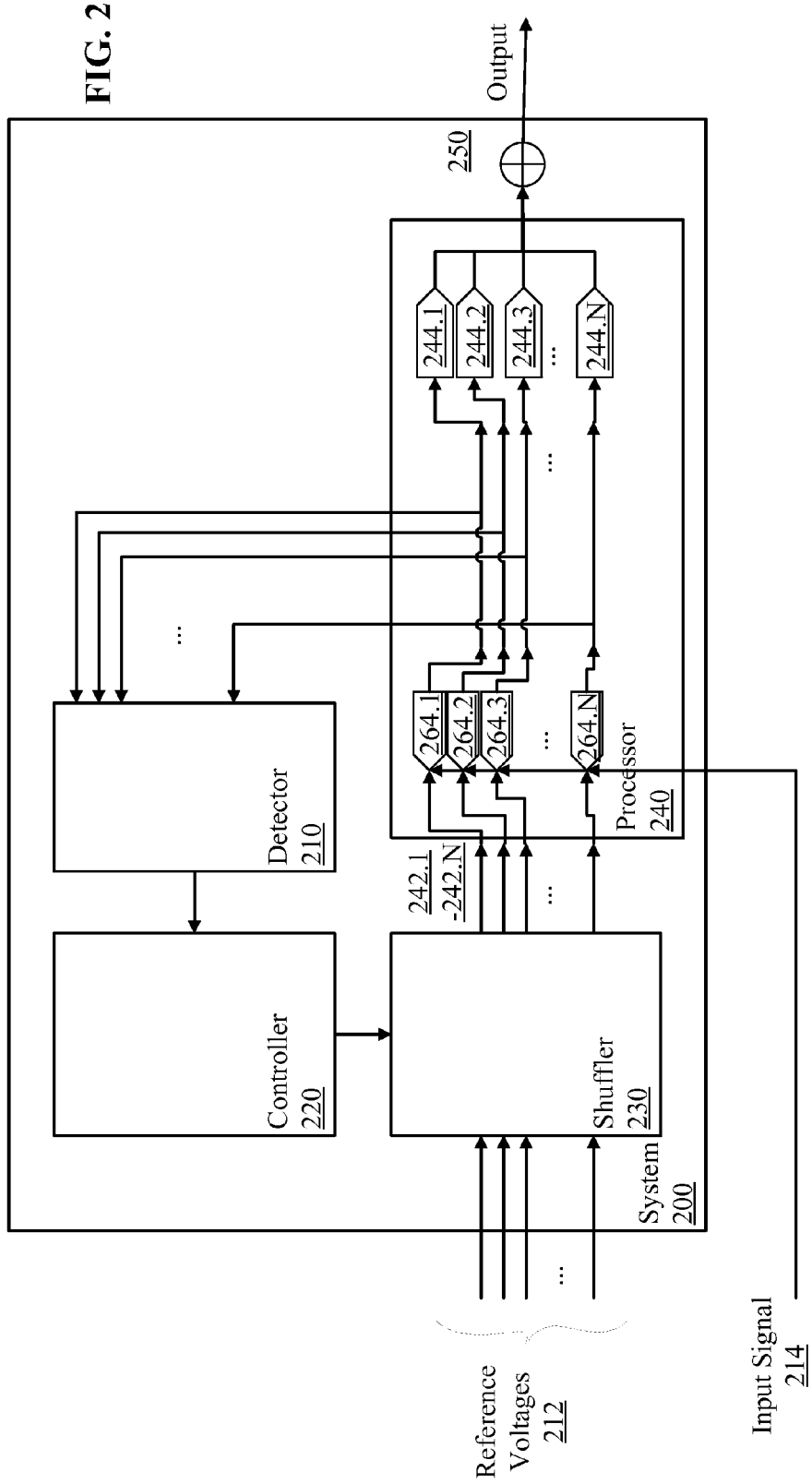
FIG. 2 illustrates a simplified block diagram of a system according to an embodiment of the present disclosure.

FIG. 2 illustrates an alternative embodiment configuration where detector 210 detects the input signal 214 indirectly, after the input signal 214 has been converted to digital form by ADC's 264.1-264.N, which may be shuffled by shuffler 230. This configuration allows the system 200 to shuffle the ADC's 264.1-264.N, and thus further reduce any distortions from mismatches in the analog to digital signal conversion. In this configuration, each pair of ADC's 264.1-264.N and DAC's 244.1-244.N may be considered as each processing element. However, it may be also possible to separate the ADC's and DAC's, by adding another shuffler between the ADC's and DAC's.

In system 200, the shuffler 230 may receive a plurality of reference voltages 212 and shuffle channels 242.1-242.N at the input the processing elements in processor 240. The controller 220 may control the shuffler 230 based upon detection of signal amplitude by detector 210, similar to in system 100. The reference voltages 212 are channeled to the input of the ADC's 264.1-264.N to be used as reference to generate digital form of input signal 214, which may be in analog form. By this configuration, the shuffler 230 may shuffle the processing elements in processor 240 to reduce distortion caused by element mismatches, while reducing noise that may be caused by shuffling. Optionally, a summer 250 may be included to merge signals. The processing elements may include sample-and-hold circuits, ADC's, DAC's, or filters.

According to an exemplary embodiment of the present invention illustrated in FIG. 4, a method 400 may include block 410, detecting by the detector 110, a signal 112.

At block 420, the controller 120 may control the shuffler 130 based upon the signal 112.

At block 430, the shuffler 130 may shuffle a plurality of channels 142.1-142.N at the input of a plurality of processing elements 144.1-144.N of the processor 140 based upon the signal 112.

At block 440, the processor 140 may process the signal 112 according to the plurality of channels 142.1-142.N as configured by the shuffler 130.

The shuffler 130 may shuffle the plurality of channels 142.1-142.N at the input of the plurality of processing elements 144.1-144.N of the processor 140 based upon amplitude or frequency of the signal 112, such that after each shuffle, at least one of the processing elements 144.1-144.N occupy different positions in the signal processing path of the processor 140 relative to before shuffling. The controller 120 may control the shuffler 130 to begin shuffling after determining that the amplitude of the signal 112 is greater than or equal to a first threshold. The controller 120 may control the shuffler 130 to begin shuffling after determining that the amplitude of the signal 112 is greater than or equal to the first threshold over a first period of time, and may switch off shuffling after determining that the amplitude of the signal 112 is less than the first threshold over a second period of time.

It is appreciated that the disclosure is not limited to the described embodiments, and that any number of scenarios and embodiments in which conflicting appointments exist may be resolved.

Although the disclosure has been described with reference to several exemplary embodiments, it is understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular means, materials and embodiments, the disclosure is not intended to be limited to the particulars disclosed; rather the disclosure extends to all functionally equivalent structures, methods, and uses such as are within the scope of the appended claims.

While the computer-readable medium may be described as a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the embodiments disclosed herein.

The computer-readable medium may comprise a non-transitory computer-readable medium or media and/or comprise a transitory computer-readable medium or media. In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. Accordingly, the disclosure is considered to include any computer-readable medium or other equivalents and successor media, in which data or instructions may be stored.

Although the present application describes specific embodiments which may be implemented as code segments in computer-readable media, it is to be understood that dedicated hardware implementations, such as application specific integrated circuits, programmable logic arrays and other hardware devices, can be constructed to implement one or more of the embodiments described herein. Applications that may include the various embodiments set forth herein may broadly include a variety of electronic and computer systems. Accordingly, the present application may encompass software, firmware, and hardware implementations, or combinations thereof.

The present specification describes components and functions that may be implemented in particular embodiments with reference to particular standards and protocols, the disclosure is not limited to such standards and protocols. Such standards are periodically superseded by faster or more efficient equivalents having essentially the same functions. Accordingly, replacement standards and protocols having the same or similar functions are considered equivalents thereof.

The illustrations of the embodiments described herein are intended to provide a general understanding of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "disclosure" merely for convenience and without intending to voluntarily limit the scope of this application to any particular disclosure or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

We claim:

1. A method for reducing noise in a system due to shuffling of processing elements, the method comprising:
    shuffling, by a shuffler, a plurality of channels at inputs of the processing elements periodically at a first non-zero frequency;
    detecting, by a detector, one or more first characteristics of a signal being processed by the processing elements; and
    shuffling, by the shuffler, the plurality of channels periodically at a second non-zero frequency different from the first non-zero frequency in response to detecting the one or more first characteristics of the signal.

2. The method of claim 1, further comprising:
    processing, by the processing elements, the signal according to the plurality of channels as configured by the shuffler.

3. The method of claim 1, wherein:
    shuffling the plurality of channels periodically such that after each shuffle, at least one of the processing elements occupy different position in a signal processing path relative to before shuffling.

4. The method of claim 1, wherein:
    shuffling the plurality of channels periodically at the first non-zero frequency or at the second non-zero frequency comprises shuffling the processing elements such that at least one of the processing elements occupy different positions in a signal processing path once every clock period of the first non-zero frequency or the second non-zero frequency respectively.

5. The method of claim 1, further comprising:
detecting, by the detector, one or more second characteristics of the signal; and
shuffling, by the shuffler, the plurality of channels periodically at a third non-zero frequency different from the second non-zero frequency in response to detecting the one or more second characteristics of the signal.

6. The method of claim 5, wherein:
the one or more first characteristics comprises an amplitude of the signal being between a first threshold and a second threshold over a first period of time;
the one or more second characteristics comprises the amplitude of the signal being greater than or equal to a second threshold over a second period of time;
the first threshold is less than the second threshold; and
the first non-zero frequency is less than the second non-zero frequency.

7. The method of claim 5, wherein:
the first non-zero frequency is less than the second non-zero frequency;
the second non-zero frequency is greater than the third non-zero frequency; and
the method further comprising controlling the shuffler to switch from shuffling at the first non-zero frequency to the second non-zero frequency with less delay than switching from shuffling at the second non-zero frequency to the third non-zero frequency.

8. The method of claim 5, wherein:
the first non-zero frequency is less than the second non-zero frequency;
the second non-zero frequency is greater than the third non-zero frequency;
controlling the shuffler to switch from shuffling at the first non-zero frequency to the second non-zero frequency after detecting the one or more first characteristics of the signal for a first duration; and
controlling the shuffler to switch from shuffling at the second non-zero frequency to the third non-zero frequency after detecting the one or more second characteristics of the signal for a second duration longer than the first duration.

9. The method of claim 5, wherein:
the first non-zero frequency is less than the second non-zero frequency;
the second non-zero frequency is greater than the third non-zero frequency; and
the method further comprises shuffling, by the shuffler, the plurality of channels periodically at the third non-zero frequency after detecting the one or more second characteristics for a non-zero period of time.

10. The method of claim 1, further comprising:
turning off shuffling upon determining that an amplitude of the signal is less than a first threshold for a predetermined non-zero period of time.

11. A system for reducing noise associated with shuffling, the system comprising:
a plurality of processing elements for processing a signal;
a shuffler to periodically shuffle a plurality of channels at inputs of the plurality of processing elements, such that after each shuffle, at least one of the processing elements occupy different position in a signal processing path relative to before shuffling;
a detector to detect one or more characteristics of the signal being processed by the processing elements; and
a controller to control the shuffler to switch between different non-zero shuffling frequencies of the shuffler based on the one or more characteristics of the signal.

12. The system of claim 11, wherein:
the detector detects the one or more characteristics of the signal indirectly from the processing elements after the signal is converted to digital form by analog-to-digital converters.

13. The system of claim 11, wherein each processing element comprises at least one of: sample-and-hold circuit, analog-to-digital converter, digital-to-analog converter, or filter.

14. The system of claim 11, wherein:
each processing element comprises a pair of analog-to-digital converter and digital-to-analog converter; and
the shuffler shuffles reference voltages channeled to inputs of analog-to-digital converters.

15. The system of claim 11, further comprising:
a timer for measuring a first predetermined non-zero period of time used as a delay when the controller switches from a higher non-zero shuffling frequency to a lower non-zero shuffling frequency.

16. The system of claim 11, further comprising:
a timer for measuring a second predetermined non-zero period of time used as a delay when the controller switches the shuffler off in response to an amplitude of the signal being less than a first threshold.

17. The system of claim 11, wherein the shuffler comprises switches controlled by the controller to shuffle the plurality of channels and re-arrange association of processing elements to different bits after each shuffle.

18. The system of claim 11, wherein the controller further randomizes the different non-zero shuffling frequencies within ranges of frequencies.

19. The system of claim 11, wherein the controller further tunes the different non-zero shuffling frequencies and thresholds used as the one or more characteristics of the signal to avoid specific frequencies causing noise in the system.

20. The system of claim 11, wherein the one or more characteristics of the signal comprises one or more of the following:
amplitude of the signal;
amplitude of a selective range of frequencies of the signal;
root mean square amplitude value of the signal; and
frequency of the signal.

21. The system of claim 11, wherein the controller determines an amount of distortion at an output of the system to dynamically adjust or tune one or more parameters for the detector or the shuffler.

22. A data converter with adaptive shuffling to reduce shuffling noise, the converter comprising:
a plurality of analog-to-digital converters;
a plurality of digital-to-analog converters coupled to respective outputs of the analog-to-digital converters;
a shuffler to receive a plurality of reference voltages to inputs of the analog-to-digital converters and shuffle the reference voltages channeled to the analog-to-digital converters periodically, such that after each shuffle, the analog-to-digital converters and the digital-to-analog converters occupy different positions in a signal processing path; and
a controller to control the shuffler to change non-zero shuffling frequencies of the shuffler based on one or more characteristics of the signal.

* * * * *